United States Patent
Beck et al.

(10) Patent No.: US 7,799,420 B2
(45) Date of Patent: Sep. 21, 2010

(54) METHOD FOR PRODUCING A NONOSTRUCTURED FUNCTIONAL COATING AND A COATING THAT CAN BE PRODUCED ACCORDING TO SAID METHOD

(75) Inventors: Thomas Beck, Kirchberg (DE); Alexander Schattke, Stuttgart (DE); Sascha Henke, Weil der Stadt (DE); Veit Schier, Echteringen (DE)

(73) Assignees: Robert Bosch GmbH, Stuttgart (DE); Walter AG, Tubingen (DE)

( * ) Notice: Subject to any disclaimer, the term of this patent is extended or adjusted under 35 U.S.C. 154(b) by 0 days.

(21) Appl. No.: 10/487,817

(22) PCT Filed: Aug. 22, 2002

(86) PCT No.: PCT/DE02/03074

§ 371 (c)(1),
(2), (4) Date: Sep. 1, 2004

(87) PCT Pub. No.: WO03/018862

PCT Pub. Date: Mar. 6, 2003

(65) Prior Publication Data

US 2005/0011748 A1    Jan. 20, 2005

(30) Foreign Application Priority Data

Aug. 25, 2001 (DE) ................................ 101 41 696

(51) Int. Cl.
*B32B 9/00* (2006.01)

(52) U.S. Cl. ............................ 428/325; 51/307; 51/309; 428/323; 428/408; 428/472; 428/701; 428/702

(58) Field of Classification Search ................. 427/569; 204/192.1; 428/688, 689, 323, 325, 408, 428/472, 469, 698, 699, 701, 702, 468; 51/307, 51/309

See application file for complete search history.

(56) References Cited

U.S. PATENT DOCUMENTS 4,180,400 A * 12/1979 Smith et al. .................... 75/235

(Continued)

FOREIGN PATENT DOCUMENTS

DE        43 24 683        11/1994

(Continued)

OTHER PUBLICATIONS

Voevodin et al "Tribological performance and tribochemistry of nanocrystalline WC/amorphous diamond-like carbon composites" Thin Solid Films 342 (199) 194-200.*

(Continued)

*Primary Examiner*—Archene Turner
(74) *Attorney, Agent, or Firm*—Kenyon & Kenyon LLP

(57) ABSTRACT

A method for producing a nanostructured, in particular a ceramic-like functional coating on a substrate is described. To that end, using at least one plasma source, a pulsed plasma is produced with which a matrix phase and at least one nanoscale interstitial phase embedded in it are deposited on the substrate via a material input. Preferably a plurality of pulsed plasma sources that are time-correlated or synchronized with each other are used. Also proposed is a nanostructured functional coating, in particular one producible by this method, which is free of chlorine and/or sulfur, and which contains at least one metal and/or at least one element selected from the group oxygen, hydrogen, nitrogen, carbon, helium, argon or neon.

16 Claims, 1 Drawing Sheet

U.S. PATENT DOCUMENTS

| | | | | |
|---|---|---|---|---|
| 4,650,724 | A * | 3/1987 | Umino et al. | 428/659 |
| 4,701,381 | A * | 10/1987 | Jack | 428/548 |
| 4,714,660 | A * | 12/1987 | Gates, Jr. | 428/699 |
| 4,950,558 | A * | 8/1990 | Sarin | 428/701 |
| 5,030,522 | A * | 7/1991 | Luthier et al. | 428/702 |
| 5,308,650 | A * | 5/1994 | Krummel et al. | 427/570 |
| 5,626,922 | A * | 5/1997 | Miyanaga et al. | 427/535 |
| 5,643,638 | A * | 7/1997 | Otto et al. | 427/569 |
| 5,733,609 | A * | 3/1998 | Wang | 427/561 |
| 5,852,303 | A * | 12/1998 | Cuomo et al. | 257/77 |
| 5,922,180 | A * | 7/1999 | Hoshino | 204/298.06 |
| 6,080,470 | A * | 6/2000 | Dorfman | 427/408 |
| 6,093,457 | A * | 7/2000 | Okumura et al. | 427/569 |
| 6,159,763 | A * | 12/2000 | Sakai et al. | 438/97 |
| 6,200,651 | B1 * | 3/2001 | Roche et al. | 427/571 |
| 6,436,481 | B1 * | 8/2002 | Chabrecek et al. | 427/488 |
| 6,482,537 | B1 * | 11/2002 | Strangman et al. | 428/633 |
| 6,582,566 | B2 * | 6/2003 | List et al. | 204/192.1 |
| 6,613,393 | B1 * | 9/2003 | Rauschnabel et al. | 427/488 |
| 6,670,543 | B2 * | 12/2003 | Lohmeyer et al. | 136/258 |
| 6,740,287 | B2 * | 5/2004 | Billiet et al. | 264/669 |
| 6,797,336 | B2 * | 9/2004 | Garvey et al. | 427/561 |
| 6,866,255 | B2 * | 3/2005 | Fork et al. | 267/37.1 |

FOREIGN PATENT DOCUMENTS

| | | |
|---|---|---|
| DE | 195 38 110 | 4/1997 |
| DE | 197 40 793 | 3/1999 |
| DE | 198 24 364 | 12/1999 |
| DE | 101 04 611 | 8/2002 |
| WO | 98/46384 | * 10/1998 |

OTHER PUBLICATIONS

Venkatraman et al "Tribological properties of diamond-like nanocomposites coatings at high temperatures" Surface & Caotings Technology 115 (1999) 215-221.*

Niederhofer et al "Structural properties internal stress and thermal stability of nc TiN/a-Si(3)N(4), nc-TiN/TiSi(X) and nc-(Ti(1-X)Al(Y)Si(X))N superhard nanocomposite coatings reaching the hardness of diamond" Surface & Caotings Technology 120-121 (1999) 173-178.*

Musil et al "ZrN/Cu nanocomposite film- a novel superhard material" Surface & Caotings Technology 120-121 (1999) 179-183.*

M. Diserens et al., *Improving the Properties of Titaniumn Nitride by Incorporation of Silicon,* 25th International Conf. on Metallurgical Coatings and Thin Films, San Diego, CA, Apr. 27-May 5, 2001, pp. 241-246.

Monteiro et al., *Synthesis and Characterization of Thin Films of WC/subx/Produced by Mixing W and C Plasma Streams,* $24^{th}$ Intl Conf. on Metalllurgical Coatings and Thin Films, San Diego, CA, Apr. 21-25, 1997, vol. 94-95, No. 1-3, pp. 220-225.

Hirasawa et al., *Synthesis of Gas Nanoparticles by Digital Radio Frequency Puttering,* Applied Physics Letters, American Institute of Physics, NY, Dec. 4, 1995, vol. 67, No. 23, pp. 3483-3485.

Hauert et al., *Research News New Coatings by Nanostructuring,* Advanced Materials, Weinheim, Germany, vol. 11, No. 2, Jan. 22, 1999, pp. 175-177.

Schiller et al., *Pre-treatment—Coating After-treatment,* Technische Rundschau, Bern, Switzerland, vol. 80, No. 3, Jan. 17, 1997, pp. 32-34.

* cited by examiner

METHOD FOR PRODUCING A NONOSTRUCTURED FUNCTIONAL COATING AND A COATING THAT CAN BE PRODUCED ACCORDING TO SAID METHOD

FIELD OF THE INVENTION

The present invention relates to a method for producing a nanostructured, in particular a ceramic-like functional coating on a substrate, and a nanostructured functional coating producible using the method.

BACKGROUND INFORMATION

Wear-protection coatings, in particular in the form of coatings of hard material based on a carbonitride, are known in single-layer or multiple-layer structure with layer thicknesses in the micron range, both on tools and on parts.

Disadvantages of such coatings are the often relatively high coefficients of friction, occurrence of intrinsic tensions and resulting reduction of adhesive strength, and the great brittleness in comparison to the hardness. Furthermore, improving the wear-resistance of these coatings by increasing the hardness has a detrimental effect on other desired properties, such as toughness, impact resistance and substrate adhesion.

In addition to hard material coatings based on a carbonitride, friction-reducing wear-resistant coatings of diamond-like carbon (DLC) and molybdenum disilicide are also known. However, their disadvantages include their relatively low abrasion resistance, inadequate resistance to media, and limited temperature resistance, less than 350° C. in the case of DLC.

To overcome the named disadvantages, functional coatings that are already nanostructured have also been developed, in which a nanocrystalline phase is present that is embedded in an amorphous or crystalline matrix phase.

The primary methods used to produce such nanostructured coatings are CVD (chemical vapor deposition) and PVD (physical vapor deposition). In particular, the PVD methods, such as magnetron sputtering or arc vaporization, are characterized by great flexibility in the selection of material, and hence offer the possibility of influencing or adjusting the layer structure in a controlled manner according to the desired application.

It is proposed for example by R. Hauert et al., Advanced Materials, 11, No. 2 (1999), pp. 175-177, that a PACVD process (plasma activated chemical vapor deposition) be used to embed nano-scale titanium nitride particles having a particulate size of 10 nm to 20 nm in an amorphous silicon nitride matrix or a matrix of amorphous silicon.

M. Diserens et al., Interface and Coatings Technology, 108 to 109 (1998), pp. 241-246, describe a PACVD method in which a nanostructured (TI, Si)N coating is produced on a substrate in a vacuum chamber at temperatures under 350° C. using a magnetron sputtering method (reactive unbalanced magnetron sputtering). Specifically, nano-scale or nanocrystalline titanium nitride particles having a mean crystallite size of around 20 nm are present there, embedded in an amorphous silicon or silicon nitride matrix. To ensure an additional input of power during deposition of the coating on the substrate, a high-frequency substrate voltage (bias voltage) between 0 V and −140 V is also applied there to the substrate being coated.

Finally, German Published Patent Application No. 101 04 611 contains a description of a device for coating a substrate with a ceramic-like coating, whereby a material is deposited on a substrate using a source of material and a plasma. There, a power source that is different from the source of material is provided to input power at a defined location into the material which is in front of or on the surface.

SUMMARY OF THE INVENTION

The method according to the present invention for producing a nanostructured functional coating has the advantage over the related art that, because of the pulsed plasma source used, a substantially higher ion density is achieved in the plasma; i.e., it is now possible in a simple way to produce coatings that require a high ion density during deposition. The deposition of such coatings is only possible in conventional PACVD processes with the help of an additional ionization source, which may now be omitted.

In particular, the particles or atoms deposited or striking the substrate initially exhibit a relatively high kinetic energy, which is sufficient to form nano-scale crystallites on the substrate through diffusion processes, or to promote microcrystallite formation there. In addition, because of the high ion energy, at least a partial shattering of microcrystallites which may be present in the produced plasmas and/or initially deposited on the substrate is achieved, which also favors the desired nanocrystalline growth of the interstitial phase.

Another advantage of the method according to the present invention is that because of the pulsed plasma source employed and the resulting higher ionization of the materials or atoms utilized for coating, the surface energy in the vicinity of the substrate to be coated is adjustable in a controlled manner to a level necessary for forming the desired nanostructured texture.

In addition, the method according to the present invention has the advantage of a generally simpler process technology, using a reduced number of system components. For example, it now permits a largely charge-independent and component-independent process management; that is, it is significantly more flexible than known RF techniques, i.e., methods that work with a high frequency substrate electrode voltage.

Finally, another significant advantage of the method according to the present invention is that the substrate and/or the functional coating deposited on it are heated during production of the coating only to temperatures of a maximum of 250° C., in particular less than 200° C. In this respect it is often possible to dispense entirely with additional cooling of the substrate during deposition of the coating, or only a conventional cooling device having a comparatively low cooling capacity is needed.

The nanostructured functional coating according to the present invention has the advantage that, in contrast to the coatings known from the related art, which are produced for example by CVD methods, it is producible free of unwanted reaction residues such as residues of chlorine or sulfur from corresponding process gases. In particular, in the functional coatings produced in particular by the method according to the present invention, besides the elements that define the composition of the functional coating produced; such as O, H, N, C and/or other metals, only the noble gas utilized as plasma gas is detectable.

It is advantageous that with the method according to the present invention both single-layer and multiple-layer coatings, in particular with differing composition or differing properties, may be deposited on parts or cutting tools. In addition, the nanostructured functional coating produced, or at least a partial layer of the functional coating, may have a chemically graduated composition; i.e., the chemical composition of the coating changes as a function of the coating thickness.

When pulsing the plasma source, it has proven to be advantageous, in the interest of high ion density and efficient deposition, for the plasma source to be pulsed at a frequency of 500 Hz to 100 kHz, in particular 10 kHz to 90 kHz. The shape of the pulses utilized may be varied in a simple way and adapted to the particular application; i.e., depending on the choice made in the individual case it is possible to use at least approximately rectangular, trapezoidal, sawtooth or sinewave pulse shapes, which also have variably adjustable rising or falling functions. In addition, the pulsing of the utilized plasma sources may be either unipolar or bipolar.

Finally, it is advantageous for the pulsing of the plasma source to be done with a pulse-to-pause ratio between 1:10 and 2:1, in particular 1:4 to 1:1, with the plasma source being operated with a maximum pulse power of 5 kW to 40 kW. In addition, to carry out the method according to the present invention, aside from the pulsing, advantageous use may be made of established and customary plasma sources such as sputtering sources, preferably magnetron sputtering sources, or else arc vapor sources.

One particularly advantageous embodiment of the method according to the present invention provides for the use of a plurality of plasma sources that are operated in time correlation or pulsed in synchronization with each other, each of which conveys a material or a compound to the plasma associated with the plasma source for application of the material onto the substrate, possibly after reacting with a reactive gas. Two or three plasma sources are preferably utilized, which are pulsed alternately, in particular in unipolar or bipolar operation.

Finally, another advantage of the method according to the present invention is that in addition to the pulsed plasma source, an additional power source which is different from the plasma source may also be used if necessary to input power into the material precipitated from the plasma on the substrate, i.e., the functional coating produced, for example to provide a source of activation energy for diffusion processes. This input of power then takes place in the manner proposed in DE 101 04 611.1-45, either in front of and/or on the substrate, by using a microwave unit, an additional ion source unit, a hollow cathode unit, a UV unit to irradiate the substrate with UV light, an electrical field produced between the plasma source and the substrate, and/or by applying a high-frequency substrate electrode voltage (bias voltage).

DETAILED DESCRIPTION

Figure 1:
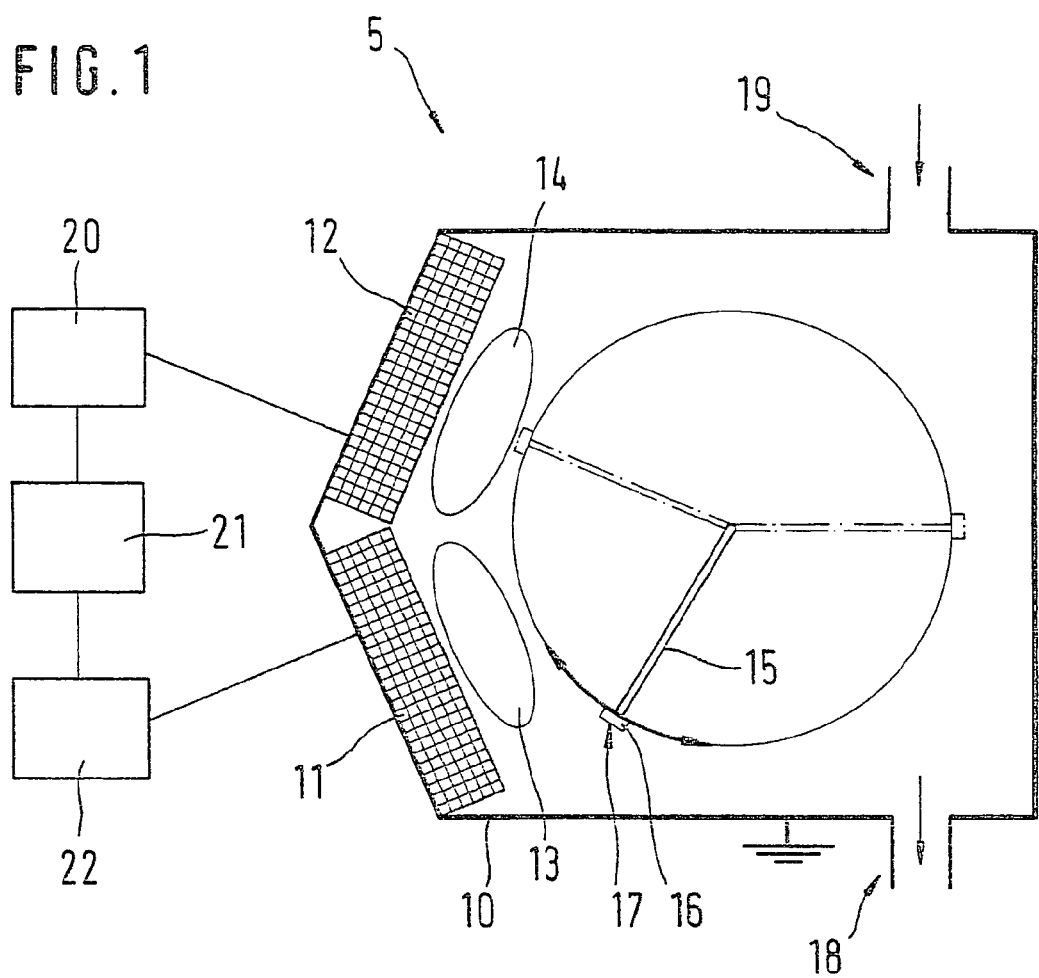
FIG. 1 shows a schematic sketch of a magnetron sputtering source for carrying out the method according to the present invention.

The present invention is based on a coating system 5 represented in FIG. 1, as described in similar form in M. Diserens et al., Interface and Coatings Technology, 108 to 109 (1998), p. 242.

In detail, coating system 5 has a grounded vacuum chamber 10, a first plasma source 11, a second plasma source 12, a substrate support 15 with a substrate 16 on it, a gas outlet 18 and a gas inlet 19. The design also provides for first plasma source 11 to be used in producing a first plasma 13 that is associated with it, and for second plasma source 12 to be used in producing a second plasma 14 that is associated with it, from which plasmas a coating 17 is deposited on the surface of substrate 16 via a material-input.

FIG. 1 also shows that first plasma source 11 is connected to a first high voltage source 22 and second plasma source 12 to a second high voltage source 20, with whose aid plasma sources 11, 12 are each pulsable initially independently of each other. In addition, an electronic control unit 21 connected to the two high voltage sources 20, 22 is provided, which effects a time-correlated pulsing of the two plasma sources 11, 12 relative to each other, in particular an alternate pulsing of the two plasma sources 11, 12.

It should be emphasized at this point that in principle one common high voltage source is sufficient to supply the two plasma sources 11, 12, which then have an appropriate high voltage for producing plasma applied to them through control unit 21, for example alternately. Furthermore, control unit 21 may also be integrated into one of the high voltage sources 20, 22.

Figure 2:
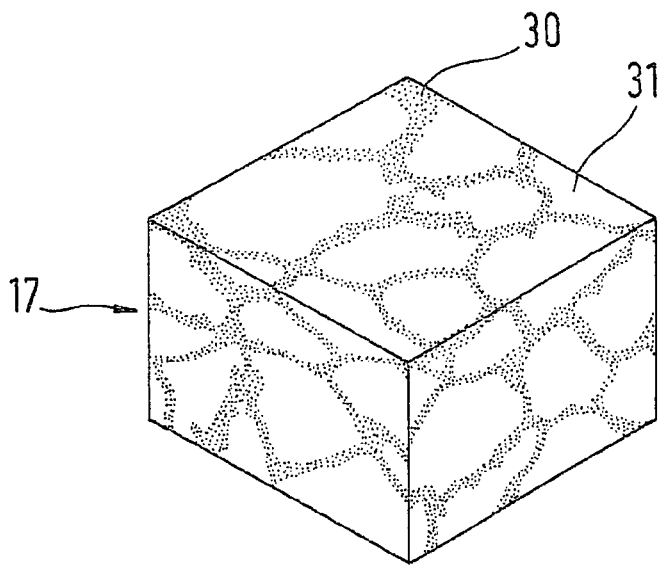
FIG. 2 shows a schematic, three-dimensional representation of a section of a produced functional coating.

FIG. 2 shows a nanostructured functional coating 17 produced using coating system 5 in three-dimensional sectional view, a nano-scale interstitial phase 31 being embedded in a matrix phase 30.

To produce a nano-scale titanium nitride interstitial phase 31 in a matrix phase 30 of amorphous silicon nitride on a part made of a metal such as tool steel, first plasma source 11 of coating system 5 according to FIG. 1 is fitted with a cathode having a titanium target and second plasma source 12 with a cathode having a silicon target. At the same time, nitrogen as the reactive gas, into which argon has also been mixed as the plasma gas, is conducted through gas inlet 19 to chamber 10. Additionally, the two plasma sources 11, 12 are alternately pulsed bipolarly with a trapezoidal pulse shape at a pulse frequency between 20 kHz and 70 kHz and a pulse-to-pause ratio of 1:4 to 3:4.

In particular, one of the two plasma sources 11, 12 is active right when a pulse pause is present at the other, i.e., when the intensity of the respective associated plasma 13, 14 has reached a minimum, or is about to be extinguished or has already been extinguished. The maximum pulse power of each of the two plasma sources 11, 12 is for example 20 kW, corresponding to a mean power of 20 kW for conventional DC magnetron operation.

The pulsing of plasma 13 or of plasma 14 is thus generally to be understood as a change in the respective plasma intensity over time between a maximum intensity and a minimum intensity, where the minimum intensity is preferably given by extinction of the particular plasma 13, 14 in the pulse pauses. Alternately, the minimum intensity may also be given by the particular plasma 13, 14 being operated in the pulse pauses with process parameters slightly above those that would lead to extinction, so that it is not extinguished, but the minimum intensity is substantially lower than the maximum intensity.

Plasma sources 11, 12 are preferably sputtering sources, whose efficiency is reinforced by a magnetron; i.e., they atomize a material that is used as the cathode or target. This material is for example in part a metal or metal oxide provided by a plasma source 11, 12, in particular titanium, chromium, copper or zirconium, and in part silicon or carbon provided by the other plasma source 11, 12. In principle, however, just one plasma source 11, 12 with an appropriate target, as well as a suitable reactive gas, is sufficient to carry out the method according to the present invention, i.e., to deposit a nanostructured functional coating. Preferably, however, two or more plasma sources 11, 12 are employed, with reactive gases added, preferably on a timed basis.

Finally, FIG. 1 shows that substrate 16 is preferably positioned on a rotating substrate support 15, so that it is periodically conveyed past the two plasma sources 11, 12 with their respective associated plasmas 13, 14. Thus each time substrate 16 is passed through the zone of influence of plasmas 13, 14, an application of material onto the surface of substrate 16 occurs.

It should also be mentioned that the production of functional coating 17 in chamber 10 occurs at a working pressure of $10^{-4}$ mbar to $10^{-2}$ mbar, for example $10^{-3}$ mbar. To that end, suitable means—not shown—are provided to ensure an appropriate vacuum in chamber 10. Substrate 16 is for example a metallic substrate, in particular a metal part or a cutting tool, which is connected to grounded chamber 10 with an electrically conductive connection via substrate support 16.

Use of the explained coating method makes it possible, all-in-all, for the substrate and/or the functional coating 17 on the substrate to be heated to a temperature of less than 200° C., in particular merely to approximately 150° C.

Through analysis of the structure of coating 17 produced as described, it was found that a largely amorphous matrix phase 30 of silicon nitride has been produced, in which a nano-scale or nano-crystalline titanium nitride interstitial phase 31 is embedded.

Depending on how the process is conducted, the mean grain size of interstitial phase 31 is approximately 1 nm to approximately 100 nm, preferably approximately 3 nm to approximately 30 nm.

Depending on the material chosen for matrix phase 30, it is additionally also possible to create a metallic, microcrystalline or crystalline matrix phase 30 instead of an amorphous matrix phase 30.

Possible materials for matrix phase 30, in addition to the described silicon or silicon nitride, also include a metal, an alloy, molybdenum disilicide, amorphous carbon or DLC.

Suitable materials for the nano-scale interstitial phase 31, in addition to titanium nitride, also include a metal oxide, a different metal nitride, a metal carbide, a metal carbonitride, or some other hard material phase, in particular zirconium nitride, silicon nitride, titanium carbide, silicon carbide, titanium oxide, chromium oxide, zirconium oxide or tantalum oxide.

The preferred combinations are silicon nitride as matrix phase 30 and titanium nitride as the nano-scale interstitial phase 31, or a metal such as copper as matrix phase 30 and zirconium nitride as the nano-scale interstitial phase 31.

The composition of the matrix phase 30 to be produced or deposited, as well as of the nano-scale interstitial phase 31, depends on the materials supplied by plasma sources 11, 12 and on the reactive gas supplied to plasmas 13, 14. This is for example the nitrogen already mentioned, supplied through gas inlet 19, or alternatively oxygen, hydrogen or a gas containing carbon, in particular a hydrocarbon. Also added to the reactive gas is preferably a plasma gas such as argon or helium. It must be emphasized, however, that depending on the materials supplied by plasma sources 11, 12 and the desired composition of functional coating 17, it is also possible in principle to dispense with supplying a reactive gas, for example when a metal oxide is used as the cathode or target in one of plasma sources 11, 12. In this case only the plasma gas is fed to chamber 10.

It is also clear that by varying the material fed to first plasma 13 or second plasma 14 as a function of time, for example by changing the nature or quantity of the reactive gas supplied, a functional coating 17 built up of a plurality of partial layers having varying compositions may be deposited.

In addition it is also possible to produce a chemically graded composition of functional coating 17 or of the individual partial layers through controlled variation, in particular continuous variation, of the nature and/or quantity of the reactive gas supplied.

An extension of the exemplary embodiments explained above provides, in addition to plasma sources 11, 12, for use of an additional power source which is different from the latter, to input power into the material deposited on substrate 16 from plasmas 13, 14, this power input taking place in the material located in front of and/or on substrate 16, which forms coating 17. Suitable power sources are the devices already described in German Published Patent Application No. 101 04 611, i.e., for example a microwave unit, an ion source unit, a hollow cathode unit, a UV unit, a means of producing an electrical field between plasma source 11, 12 and substrate 16, and/or a high frequency voltage source for applying to substrate 16 a high frequency substrate voltage (bias voltage) with respect to ground.

Overall, use of the explained exemplary embodiments always produces a high-quality nanostructured, in particular ceramic, coating 17 or a corresponding coating system on substrate 16, which in addition to the nano-scale interstitial phase 31 also includes, in a further structure, a matrix phase 30, which is preferably amorphous, or metallic in the form of a refractory network, but may also be crystalline. The proportion of the surface volume of interstitial phase 31 to the total volume is very high, and the interfaces between the nanocrystallites of interstitial phase 31 and the surrounding, in particular amorphous matrix 30 are comparatively sharp. In particular, insertion of a nano-scale hard material phase of this sort produces coatings 17 with hardnesses of over 4000 HV, which exhibit a brittleness reduced due to the nanostructuring produced.

The thickness of functional coating 17 produced on substrate 16 as explained is usually in the range from 100 nm to 10 μm, in particular 500 nm to 5 μm; along with it, in addition an inherently known adhesion-promoting intermediate layer may also be provided between substrate 16 and functional coating 17, or a cover coat or flow-in coating, for example of amorphous carbon, may be provided on functional coating 17.

For substrate 16, in addition to planar substrates 16, three-dimensional parts are also possible, such as drills, shafts, bearing components, pistons, gears or the like.

What is claimed is:

1. A tool, comprising:
a nanostructure including:
a substrate; and
a functional coating deposited on the substrate, the functional coating including a matrix phase and at least one nano-scale interstitial phase embedded in the matrix phase;
wherein the functional coating is free of at least one of chlorine and sulfur and contains at least one of a metal and at least one element corresponding to one of oxygen, hydrogen, nitrogen, carbon, helium, argon, and neon,
wherein the matrix phase is one of amorphous, metallic, microcrystalline, and crystalline, and the at least one nano-scale interstitial phase includes a nanocrystalline interstitial phase with a mean grain size of 1 nm to 100 nm,
wherein the nanostructure is produced by causing at least one plasma source to produce a pulsed plasma, with which a matrix phase and at least one nano-scale interstitial phase embedded therein are deposited on a substrate via a material input, and wherein the matrix phase is made of one of a metal, an alloy, a silicon nitride, $MoSi_2$, amorphous carbon, and DLC (diamond-like carbon), and wherein a metal oxide is embedded as the nano-scale interstitial phase.

2. The tool according to claim 1, wherein the pulsing of the at least one plasma source occurs at a frequency of 500 Hz to 100 kHz using at least one of pulses having a shape that is one of at least approximately rectangular, at least approximately trapezoidal, at least approximately saw-tooth, and at least approximately sine-wave pulse-shaped, and pulses having shapes with differing rising and falling functions.

3. The tool according to claim 2, wherein the at least one plasma source is a sputtering source.

4. The tool according to claim 2, wherein the pulsing of the at least one plasma source is operated at a frequency of 10 kHz and 90 kHz.

5. The tool according to claim 2, wherein the pulsing of the at least one plasma source is operated with a pulse-to-pause ratio of 1:10 to 2:1.

6. The tool according to claim 2, wherein the pulsing of the at least one plasma source is operated with a pulse-to-pause ratio of 1:4 to 1:1.

7. The tool according to claim 2, wherein the at least one plasma source is operated with a peak pulse power of 5 kW to 40 kW.

8. The tool according to claim 1, wherein the metal oxide includes one of titanium oxide, chromium oxide, zirconium oxide and tantalum oxide.

9. The tool according to claim 1, wherein the nanocrystalline interstitial phase has a mean grain size of 3 nm to 30 nm.

10. The tool according to claim 1, wherein the pulsing of the at least one plasma source occurs at a frequency of 500 Hz to 100 kHz using at least one of pulses having a shape that is one of at least approximately rectangular, at least approximately trapezoidal, at least approximately saw-tooth, and at least approximately sine-wave pulse-shaped, and pulses having shapes with differing rising and falling functions, and wherein the metal oxide includes one of titanium oxide, chromium oxide, zirconium oxide and tantalum oxide.

11. The tool according to claim 10, wherein the at least one plasma source is a sputtering source, wherein the pulsing of the at least one plasma source is operated at a frequency of 10 kHz and 90 kHz.

12. The tool according to claim 11, wherein the pulsing of the at least one plasma source is operated with a pulse-to-pause ratio of 1:10 to 2:1.

13. The tool according to claim 12, wherein the at least one plasma source is operated with a peak pulse power of 5 kW to 40 kW, and wherein the nanocrystalline interstitial phase has a mean grain size of 3 nm to 30 nm.

14. The tool according to claim 11, wherein the pulsing of the at least one plasma source is operated with a pulse-to-pause ratio of 1:4 to 1:1.

15. The tool according to claim 14, wherein the at least one plasma source is operated with a peak pulse power of 5 kW to 40 kW, and wherein the nanocrystalline interstitial phase has a mean grain size of 3 nm to 30 nm.

16. The tool according to claim 11, wherein the at least one plasma source is operated with a peak pulse power of 5 kW to 40 kW, and wherein the nanocrystalline interstitial phase has a mean grain size of 3 nm to 30 nm.

\* \* \* \* \*